(12) United States Patent  (10) Patent No.: US 8,632,168 B2
Kojima et al.  (45) Date of Patent: Jan. 21, 2014

(54) PIEZOELECTRIC ELEMENT, LIQUID EJECTING HEAD, LIQUID EJECTING APPARATUS, AND METHODS FOR THE MANUFACTURE THEREOF

(75) Inventors: Chikara Kojima, Matsumoto (JP); Eiju Hirai, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 119 days.

(21) Appl. No.: 13/225,301

(22) Filed: Sep. 2, 2011

(65) Prior Publication Data

US 2012/0056946 A1 Mar. 8, 2012

(30) Foreign Application Priority Data

Sep. 6, 2010 (JP) .................. 2010-199043

(51) Int. Cl.
*H01L 41/00* (2013.01)
*H02N 2/00* (2006.01)
*B41J 2/045* (2006.01)

(52) U.S. Cl.
USPC ........................................... 347/68; 310/311

(58) Field of Classification Search
None
See application file for complete search history.

(56) References Cited

U.S. PATENT DOCUMENTS 7,562,451 B2 * 7/2009 Ito et al. ....................... 29/890.1
2010/0020132 A1 * 1/2010 Kim et al. ....................... 347/70

FOREIGN PATENT DOCUMENTS

JP 2009-172878 A 8/2009

* cited by examiner

*Primary Examiner* — Matthew Luu
*Assistant Examiner* — Erica Lin
(74) *Attorney, Agent, or Firm* — Kilpatrick Townsend & Stockton LLP

(57) ABSTRACT

A piezoelectric element, a liquid ejecting head and a liquid ejecting apparatus that have improved reliability are provided. Methods for the manufacture thereof are also provided. A piezoelectric element includes a vibration plate having a recess in a first surface, a first electrode formed in the recess, a piezoelectric layer formed on the vibration plate and the first electrode, and a second electrode formed on the piezoelectric layer, wherein an upper surface of the first electrode forms a continuous flat surface together with the first surface.

9 Claims, 7 Drawing Sheets

PIEZOELECTRIC ELEMENT, LIQUID EJECTING HEAD, LIQUID EJECTING APPARATUS, AND METHODS FOR THE MANUFACTURE THEREOF

This application claims a priority to Japanese Patent Application No. 2010-199043 filed on Sep. 6, 2010 which is hereby expressly incorporated by reference herein in its entirety.

BACKGROUND

1. Technical Field

The present invention relates to piezoelectric elements, liquid ejecting heads, liquid ejecting apparatuses, and methods for the manufacture thereof.

2. Related Art

Piezoelectric elements and ink jet recording heads are manufactured by thin film technology in order to reduce the thickness of the piezoelectric elements and achieve high density and high-speed drive. For example, JP-A-2009-172878 discloses an ink jet recording head producible by thin film technology.

The ink jet recording head disclosed in JP-A-2009-172878 has a piezoelectric element in which lower electrodes provided on a vibration plate are covered with respective piezoelectric layers, and an upper electrode is formed so as to continuously cover a plurality of the piezoelectric layers. According to this piezoelectric element, the upper electrode reduces the influences of, for example, water in the air on the piezoelectric layers.

When a piezoelectric element having this structure is energized, an electric field tends to be concentrated in a region where a first electrode protrudes from a vibration plate toward a piezoelectric layer (for example, around the corner of the lower electrode), possibly resulting in a crack in, for example, the piezoelectric layer. There has thus been a need for a piezoelectric element which has a reduced concentration of an electric field in a piezoelectric layer during energization.

SUMMARY

Some aspects of the invention provide piezoelectric elements which are improved in terms of reliability by reducing the electric field concentration at a piezoelectric layer, and also provide liquid ejecting heads and liquid ejecting apparatuses containing the piezoelectric elements.

A piezoelectric element according to an embodiment of an aspect of the invention includes a vibration plate having a recess in a first surface, a first electrode formed in the recess, a piezoelectric layer formed on the vibration plate and the first electrode, and a second electrode formed on the piezoelectric layer, wherein an upper surface of the first electrode forms a continuous flat surface together with the first surface.

In the invention, the word "on" is used in a sentence such as "A specific member (hereinafter, referred to as "member A") is formed on another specific member (hereinafter, referred to as "member B")". The word "on" in such sentences in the invention indicates that the member A is formed directly on the member B or that the member A is formed on the member B through another member therebetween. Similarly, the word "under" in the invention indicates that the member A is formed directly under the member B or that the member A is formed under the member B through another member therebetween.

In the above aspect, the first electrode is formed in the recess in the vibration plate, and the upper surface of the first electrode forms a continuous flat surface together with the first surface of the vibration plate. According to this configuration, the first electrode does not have a portion that protrudes from the first surface of the vibration plate toward the piezoelectric layer, and thus the electric field concentration within the piezoelectric layer is reduced. Since an electric field is applied to the piezoelectric layer more uniformly and the stress concentration is reduced, cracks are less likely to occur in the piezoelectric element, for example in the piezoelectric layer. The piezoelectric element according to the above aspect thus achieves improved reliability.

In an embodiment of the piezoelectric element, the vibration plate may be a laminate that includes a first layer constituting the first surface, and the recess may not penetrate through the first layer.

According to this embodiment, the first layer functions as a barrier layer, and the reliability of the piezoelectric element is further improved.

In an embodiment of the piezoelectric element, the vibration plate may be a laminate that includes a first layer constituting the first surface, and the recess may penetrate through the first layer.

According to this embodiment, the vibration plate is more easily deformable and the displacement of the piezoelectric element is increased.

In an embodiment of the piezoelectric element, the first layer may be zirconium oxide.

A liquid ejecting head according to an aspect of the invention includes the piezoelectric element in any of the above embodiments.

According to this aspect, a liquid ejecting head is provided which has the piezoelectric element in one aspect of the invention.

A liquid ejecting apparatus according to an aspect of the invention includes the above liquid ejecting head.

According to this aspect, a liquid ejecting apparatus is provided which has the liquid ejecting head in one aspect of the invention.

A method for manufacturing a piezoelectric element according to an embodiment of an aspect of the invention includes forming a recess in a vibration plate, forming a first electrode in the recess of the vibration plate, forming a piezoelectric layer on the vibration plate and the first electrode, and forming a second electrode on the piezoelectric layer, wherein the forming of the first electrode includes forming a conductive layer so as to fill the recess, and planarizing the multilayer structure by polishing it from the conductive layer side, and wherein the vibration plate is exposed by the planarization.

According to this aspect, a method for manufacturing the piezoelectric element in one aspect of the invention is provided. In accordance with the method, the piezoelectric layer is formed on the planarized flat surface. In this manner, the piezoelectric layer achieves a uniform thickness. Further, since the crystal growth for forming the piezoelectric layer can take place on the plane surface (interface), the obtainable piezoelectric layer has a highly uniform crystal structure. Accordingly, the method can produce piezoelectric elements having improved reliability. According to the method in this aspect, the piezoelectric layer can have a uniform thickness and a flat upper surface. Such piezoelectric layers allow other members to be provided or formed thereon with improved workability and productivity. Accordingly, the method in the above aspect can improve the yield of the piezoelectric elements.

In an embodiment of the method for manufacturing a piezoelectric element, the planarization may be performed by chemical mechanical polishing.

A method for manufacturing a liquid ejecting head according to an aspect of the invention includes carrying out the method for manufacturing a piezoelectric element in any of the above embodiments.

A method for manufacturing a liquid ejecting apparatus according to an aspect of the invention includes carrying out the method for manufacturing a liquid ejecting head in the above aspect.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described below with reference to the accompanying drawings. These embodiments do not limit the scope of the invention claimed herein. All the constituents and configurations described in the following embodiments are not necessarily essentially required in the invention.

1. Piezoelectric Elements
1-1. Structure of Piezoelectric Elements

Figure 1A:
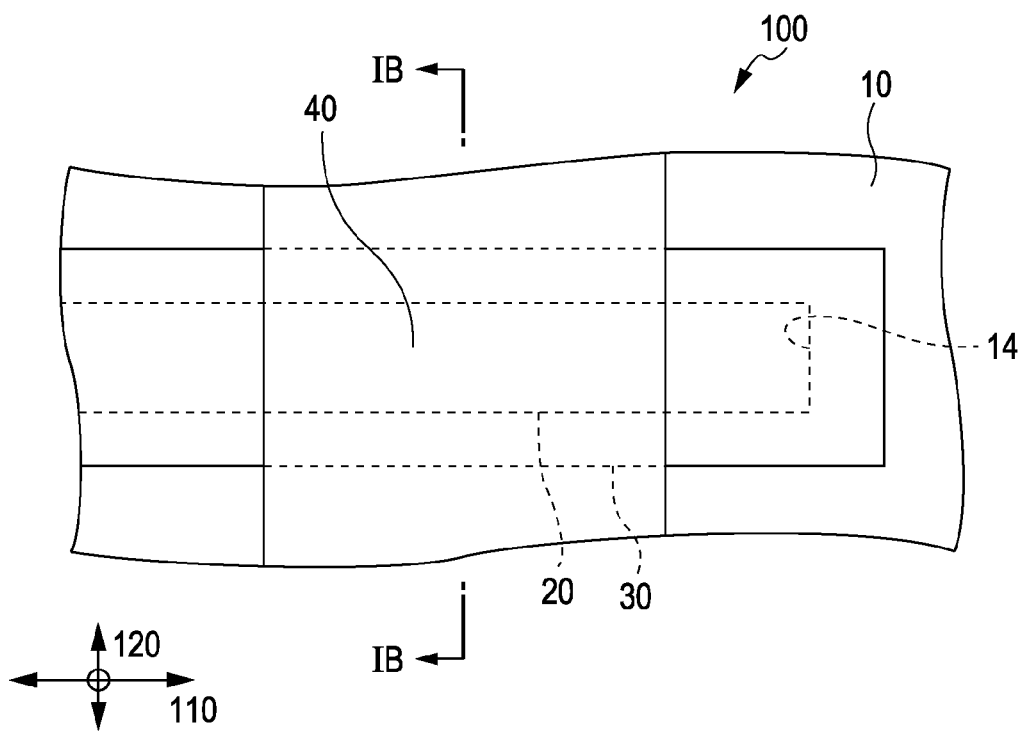
FIG. 1A is a schematic plan view illustrating a piezoelectric element according to an embodiment of the invention.
Figure 1B:
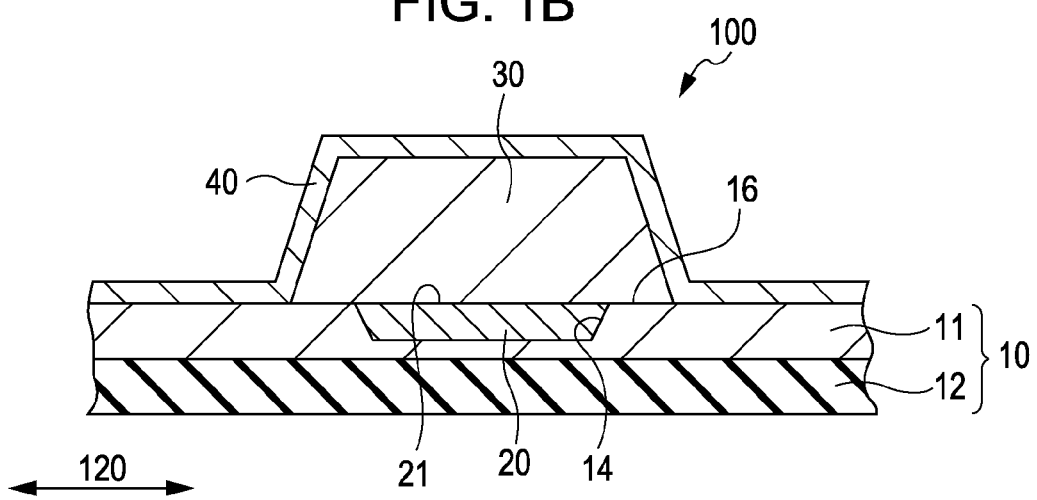
FIG. 1B is a schematic sectional view illustrating the piezoelectric element in FIG. 1A taken along line IB-IB.
Figure 2:
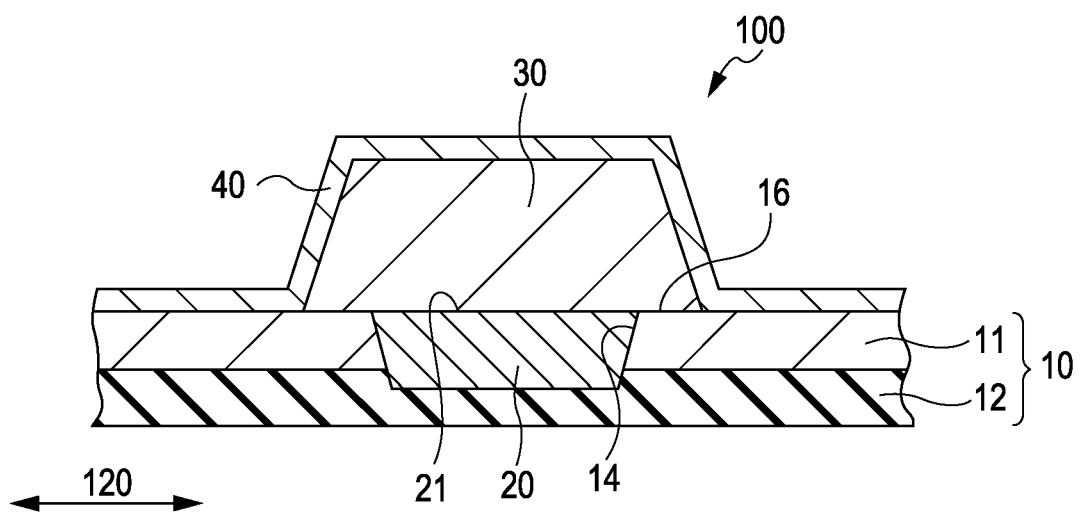
FIG. 2 is a schematic sectional view illustrating a piezoelectric element according to a modified embodiment of the invention.

FIG. 1A is a schematic plan view illustrating a piezoelectric element according to an embodiment. FIG. 1B is a schematic sectional view illustrating the piezoelectric element in FIG. 1A taken along line IB-IB. FIG. 2 is a schematic sectional view illustrating a piezoelectric element according to a modified embodiment.

As illustrated in FIGS. 1A and 1B, a piezoelectric element 100 in this embodiment includes a vibration plate 10, a first electrode 20, a piezoelectric layer 30 and a second electrode 40.

In the invention, the term "piezoelectric element" is replaceable by the term "piezoelectric actuator". That is, a piezoelectric actuator 100 may include a vibration plate 10, a first electrode 20, a piezoelectric layer 30 and a second electrode 40.

Referring to FIG. 1A, the piezoelectric element 100 has the vibration plate 10 as a substrate. The piezoelectric element 100 may be formed so as to extend in one direction as illustrated in FIG. 1A. Herein, the direction in which the piezoelectric element 100 extends is defined as a first direction 110, and the direction that intersects with the first direction is defined as a second direction 120 as illustrated in FIG. 1A. For example, the first direction 110 and the second direction 120 may be substantially orthogonal to each other.

For example, the vibration plate 10 may be a plate substrate that is formed using at least one of conductors, semiconductors and insulators. As illustrated in FIG. 1B, the vibration plate 10 has a first surface 16 (an upper surface). The first surface 16 is a surface on which the piezoelectric layer 30 and the second electrode 40 described later are provided. The vibration plate 10 may be a laminate having a plurality of layers as illustrated in FIG. 1B. Alternatively, although not shown, the vibration plate 10 may be a single layer. In the case where the vibration plate 10 is a laminate, the vibration plate 10 includes a first layer 11 that constitutes the first surface 16 as illustrated in FIG. 1B. The first layer 11 may be stacked on a second layer 12 as illustrated in FIG. 1B. Although not shown, the vibration plate 10 may contain a third layer. The vibration plate 10 may constitute an active section of a piezoelectric actuator including the piezoelectric element 100, and may constitute part of the walls of, for example, pressure generating chambers. The materials for the vibration plate 10 include inorganic nitrides such as silicon nitride, inorganic oxides such as zirconium oxide, silicon oxide and titanium oxide, and alloys such as stainless steel. In an embodiment, the vibration plate 10 may include a first layer 11 composed of zirconium oxide and a second layer 12 composed of silicon oxide. The thickness of the vibration plate 10 may be selected appropriately in accordance with, for example, the elastic modulus of the material(s). When the piezoelectric element 100 is used in a piezoelectric actuator, the thickness of the vibration plate 10 may be, for example, from 200 nm to 5000 nm. If the vibration plate 10 has a thickness of less than 200 nm, it may not deliver sufficient mechanical outputs such as vibrations. If the thickness is larger than 5000 nm, the vibration plate 10 may not vibrate or move. The vibration plate 10 can be caused to bend or vibrate by the action of the piezoelectric layer 30.

The vibration plate 10 has a recess 14 in the first surface 16 as illustrated in FIGS. 1A and 1B. The recess 14 is formed at a position in the first surface 16 on which the piezoelectric layer 30 described later will be provided. Although not shown, a plurality of recesses 14 may be arranged adjacent to each other in the vibration plate 10. The shape of the recess 14 is not particularly limited as long as it forms a depression in the first surface 16 of the vibration plate 10. The inner surface of the recess 14 may be composed of a bottom face and side faces that are continuously tapered from the first surface 16 to the bottom face. As illustrated in FIG. 1A, the bottom surface of the recess 14 may extend in the first direction 110. That is, the recess 14 may be a groove-shaped recess. Although not shown, the side surfaces of the recess 14 may extend from the first surface 16 at a perpendicular angle rather than a tapered angle. Alternatively, although not shown, the inner surface of the recess 14 may be continuously curved in a substantially arc-like shape.

As illustrated in FIG. 1B, the recess 14 may extend to a certain depth in the first layer 11 without penetrating through the first layer 11 of the vibration plate 10. According to this configuration, the portion of the first layer 11 that remains between the bottom surface of the recess 14 and the second layer 12 functions as a barrier layer to prevent, for example, the diffusion of the metal elements contained in layers such as the first electrode 20 and the piezoelectric layer 30, thereby improving the reliability of the piezoelectric element 100.

Alternatively, as illustrated in FIG. 2, the recess 14 may penetrate through the first layer 11 and into the second layer 12. According to this configuration, the thickness of the vibration plate 10 in the active region is reduced and the piezoelectric element 100 achieves an increased displacement upon application of a predetermined voltage.

As illustrated in FIGS. 1A and 1B, the first electrode 20 is formed in the recess 14 of the vibration plate 10 to fill the recess 14. As illustrated in FIG. 1B, the first electrode 20 has a surface 21 (an upper surface 21) that forms a continuous flat surface together with the first surface 16. Accordingly, the first electrode 20 is formed in a region that is determined by the shape of the recess 14 in the vibration plate 10. Since the recess 14 in this embodiment shown in FIG. 1A is formed so as to extend in the first direction 110, the first electrode 20 is formed so as to extend in the first direction 110. The first electrode 20 functions in combination with the second electrode 40, with the piezoelectric layer 30 sandwiched therebetween. For example, the first electrode 20 may be a lower electrode of the piezoelectric element 100. Although not shown, the first electrode 20 is electrically connected with a lead wire which is in electrical connection with a drive circuit. The electrical connection between the first electrode 20 and the lead wire may be established by any methods without limitation.

The materials for the first electrode 20 may be any conductive materials without limitation. Exemplary materials for the first electrode 20 include metals such as Ni, Ir, Au, Pt, W, Ti, Cr, Ag, Pd and Cu, alloys of these metals, conductive oxides of these metals or alloys (such as iridium oxide), Sr—Ru composite oxide, and La—Ni composite oxide. The first electrode 20 may be a single layer composed of any of the above materials, or may be a laminate having layers of any of the above materials.

As illustrated in FIGS. 1A and 1B, the piezoelectric layer 30 is formed between the first electrode 20 and the second electrode 40. The piezoelectric layer 30 is formed on the continuous flat surface constituted by the vibration plate 10 (the first surface 16) and the first electrode 10 (the upper surface 21) as shown in FIGS. 1A and 1B. The piezoelectric layer 30 may be formed so as to extend in the first direction 110 as illustrated in FIG. 1A. Referring to FIG. 1B, the piezoelectric layer 30 has an upper surface 31 (the surface opposite the surface on the first electrode 20 side) and tapered side surfaces on which the second electrode 40 described later is formed. The thickness of the piezoelectric layer 30 is not particularly limited as long as the piezoelectric layer 30 is substantially deformed, i.e., stretched or contracted, upon application of a voltage.

The materials for the piezoelectric layer 30 may be any piezoelectric materials having piezoelectric properties without limitation. Perovskite oxides represented by the general formula $ABO_3$ are suitably used. Specific examples of the materials include lead zirconate titanate ($Pb(Zr, Ti)O_3$), lead zirconate titanate niobate ($Pb(Zr, Ti, Nb)O_3$), barium titanate ($BaTiO_3$) and potassium sodium niobate (($K, Na)NbO_3$).

The second electrode 40 is provided on the piezoelectric layer 30 such that it opposes the first electrode 20 with the piezoelectric layer 30 therebetween. As illustrated in FIGS. 1A and 1B, the second electrode 40 may be formed so as to cover the piezoelectric layer 30 in the second direction 120. The second electrode 40 may be formed in any region without limitation as long as the second electrode overlaps with at least part of the first electrode 20 across the piezoelectric layer 30 as illustrated in FIG. 1B to form an active region 35 (a region in the piezoelectric layer 30 which is sandwiched between the first electrode 20 and the second electrode 40 and which is substantially deformed). Accordingly, a detailed shape of the second electrode 40 is determined with consideration of the design of the active region and may be determined appropriately in accordance with the desired active region. Although not shown, the second electrode 40 may continuously cover a plurality of adjacent piezoelectric layers 30.

The second electrode 40 functions in combination with the first electrode 20, with the piezoelectric layer 30 sandwiched therebetween. When the first electrode 20 is a lower electrode, the second electrode 40 may be an upper electrode. The second electrode 40 is electrically connected with a drive circuit that is not shown. The electrical connection between the second electrode 40 and the drive circuit may be established by any methods without limitation. The second electrode 40 may be electrically connected with the drive circuit via a lead wire that is not shown. Although not shown, an insulating protective layer may be formed on part of the surface of the second electrode 40.

The materials for the second electrode 40 may be any conductive materials without limitation. Exemplary materials for the second electrode 40 include metals such as Ni, Ir, Au, Pt, W, Ti, Ta, Mo, Cr, Pd and Cu, alloys of these metals, conductive oxides of these metals or alloys (such as iridium oxide), Sr—Ru composite oxide, and La—Ni composite oxide. The second electrode 40 may be a single layer composed of any of the above materials, or may be a laminate having layers of any of the above materials.

The piezoelectric element 100 according to this embodiment may have any of the aforementioned structures. For example, the piezoelectric element 100 according to this embodiment has the following characteristics.

In the piezoelectric element 100 in this embodiment, the first electrode 20 is formed in the recess 14 in the vibration plate 10, and the upper surface 21 of the first electrode 20 constitutes a continuous flat surface together with the first surface 16 of the vibration plate 10. According to this configuration, the first electrode 20 does not have a portion that protrudes from the first surface 16 of the vibration plate 10 toward the piezoelectric layer 30, and thus the electric field concentration within the piezoelectric layer 30 during energization is reduced. Since an electric field is applied to the piezoelectric layer 30 more uniformly and the concentration of stress on the constituent members is reduced, cracks are less likely to occur. Thus, the piezoelectric element 100 achieves improved reliability.

According to the piezoelectric element 100 in this embodiment, the piezoelectric layer 30 is formed on the continuous flat surface that is constituted by the vibration plate 10 (the first surface 16) and the first electrode 20 (the upper surface 21). According to this configuration of the piezoelectric element 100, the piezoelectric layer 30 can have a uniform thickness and a flat upper surface 31. Further, since the crystal growth for the piezoelectric layer 30 can take place on the plane surface (interface), the crystal can grow stably to realize a piezoelectric layer having a highly uniform crystal structure. Forming the piezoelectric layer 30 on the flat surface improves the reliability of the piezoelectric element 100 compared to that of a piezoelectric element in which a piezoelectric layer is formed so as to cover a structure. Details will be described later.

1-2. Method for Manufacturing Piezoelectric Elements

Next, there will be described a method for manufacturing the piezoelectric element 100 according to this embodiment. FIGS. 3A to 3D, and FIGS. 4A to 4D are schematic sectional views illustrating steps for manufacturing the piezoelectric element 100 according to this embodiment, wherein the left figures are sectional views with respect to the first direction 110 and the right figures are sectional views with respect to the second direction 120.

A method for manufacturing the piezoelectric element according to the above embodiment includes forming the recess 14 in the vibration plate 10, forming the first electrode 20 in the recess 14 of the vibration plate 10, forming the piezoelectric layer 30 on the vibration plate 10 and the first electrode 20, and forming the second electrode 40 on the piezoelectric layer 30.

Figure 3A:
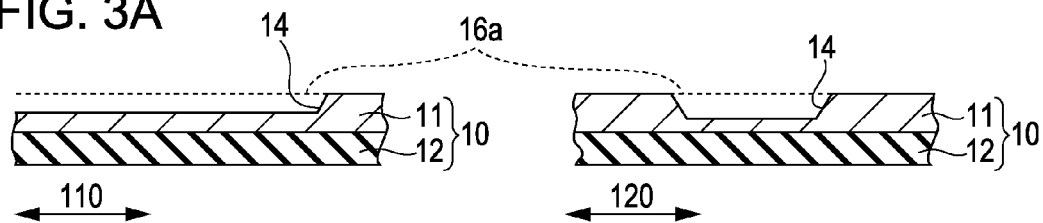
FIGS. 3A to 3D are schematic sectional views illustrating steps for manufacturing a piezoelectric element according to an embodiment of the invention.

First, as illustrated in FIG. 3A, the recess 14 is formed in the vibration plate 10. The vibration plate 10 provided herein may have a thickness that is larger than the desired thickness of the final vibration plate 10 in the piezoelectric element 100. For example, when the vibration plate 10 has the first layer 11 and the second layer 12, the first layer 11 may have a thickness that is larger than the desired thickness. Although not shown, the vibration plate 10 provided may already have the desired thickness. The recess 14 may be patterned by any methods without limitation. In an embodiment, the recess 14 may be produced by forming a resist at the desired position and patterning the vibration plate 10 according to a known photolithographic technique and/or a known etching technique. The etching technique may be wet etching or dry etching.

Herein, the surface (level) of the vibration plate 10 which has been removed by the production of the recess 14 is defined as the first surface 16a as illustrated in FIG. 3A.

Figure 3B:
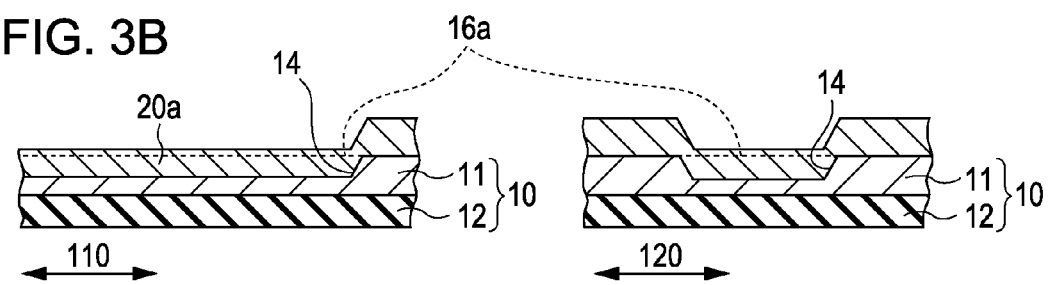

Next, as illustrated in FIG. 3B, a conductive layer 20a is formed so as to fill the recess 14 of the vibration plate 10. In an embodiment, the conductive layer 20a may be formed so as to fill the recess 14 and cover the first surface 16a as illustrated in FIG. 3B. In another embodiment, which is not shown, the conductive layer 20a may be formed such that part of the upper surface of the conductive layer 20a coincides with the first surface 16a. In still another embodiment, which is not shown, the conductive layer 20a may be formed such that the conductive layer 20a formed in the recess 14 has a thickness that is identical to the desired thickness of the first electrode 20. The conductive layer 20a may be formed by any known film-forming methods without limitation, with examples including deposition methods such as sputtering, CVD and PVD, spin coating methods, MOD methods and plating methods.

Figure 3C:
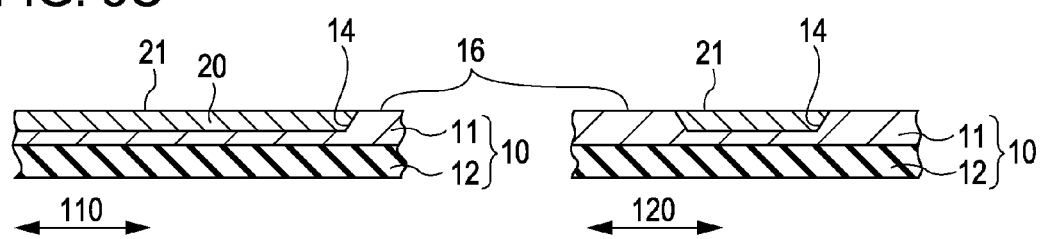

Next, as illustrated in FIG. 3C, the multilayer structure is planarized by being polished from the conductive layer 20a side. In this planarization, the vibration plate 10 covered with the conductive layer 20a is exposed. The planarization by polishing is performed so that the conductive layer 20a in the recess 14 comes to have the desired thickness. In this manner, the first electrode 20 (and the upper surface 21) in the recess 14, and the first surface 16 are formed. After the first surface 16a is exposed, the superficial portion of the first layer 11 of the vibration plate 10 may be further polished, whereby the upper surface 21 of the first electrode 20 and the first surface 16 of the vibration plate 10 can reliably constitute a continuous flat surface. The polishing may be performed by a known method such as chemical mechanical polishing (CMP) or spin on glass (SOG). In a preferred embodiment, the planarization is performed by chemical mechanical polishing (CMP), whereby the flat surface formed by the first surface 16 and the upper surface 21 can be planarized more uniformly.

Figure 3D:
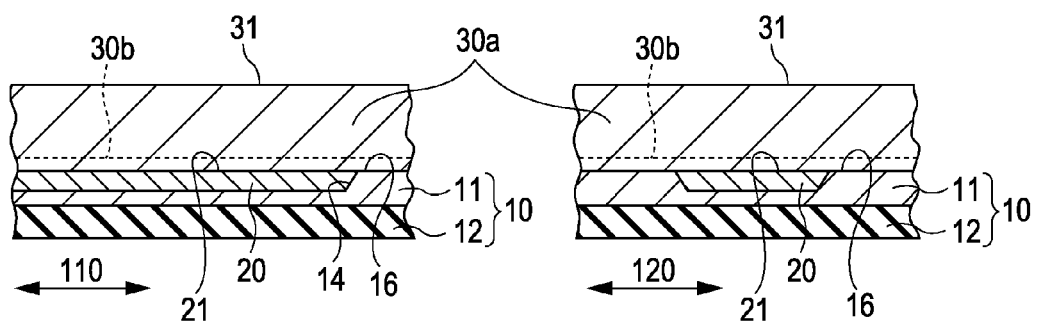

Next, as illustrated in FIG. 3D, a piezoelectric layer 30a is formed on the vibration plate 10 and the first electrode 20. The piezoelectric layer 30a may be formed by any methods without limitation, and known film-forming methods and calcination methods may be adopted. In an embodiment, a piezoelectric material that is a precursor solution prepared by, for example, a sol gel process is applied and heat treated to form the piezoelectric layer 30a. Alternatively, the piezoelectric layer 30a may be produced by spin coating, CVD, MOD, sputtering or laser ablation. The heat treatment conditions may be determined appropriately in accordance with, for example, the used process and piezoelectric material. The heat treatment conditions are not particularly limited as long as the used piezoelectric material can give a crystallized layer. In an embodiment, the heat treatment may be performed in an oxygen atmosphere at a temperature of 500° C. to 900° C. The heat treatment may include pre-calcination for the purpose of degreasing or the like.

In an embodiment, an alignment layer 30b may be formed on the flat surface formed by the first surface 16 and the upper surface 21 as illustrated in FIG. 3D. The alignment layer 30b regulates the alignment of the crystal when the piezoelectric layer 30a is crystallized by calcination. The alignment layer 30b may be, for example, a titanium layer or a lanthanum nickel oxide layer. In addition to the alignment layer 30b, an oxidation preventing layer such as a titanium nitride layer may be formed to prevent the oxidation of the conductive layer 20a.

After the piezoelectric layer 30a is formed on the flat surface defined by the first surface 16 and the upper surface 21 as illustrated in FIG. 3D, the layer is heat treated. The piezoelectric layer 30a produced in this manner has a uniform thickness and a flat upper surface 31 as shown in FIG. 3D.

Next, the piezoelectric layer 30 and the second electrode 40 are produced as illustrated in FIGS. 4A to 4D. The following describes an example of the production of the piezoelectric layer 30 and the second electrode 40. However, the production method and the sequence of the steps described below are only explanatory. The steps for the production of the piezoelectric layer 30 and the second electrode 40 may be known steps as long as the piezoelectric layer 30 and the second electrode 40 that have the aforementioned configurations are producible.

Figure 4A:
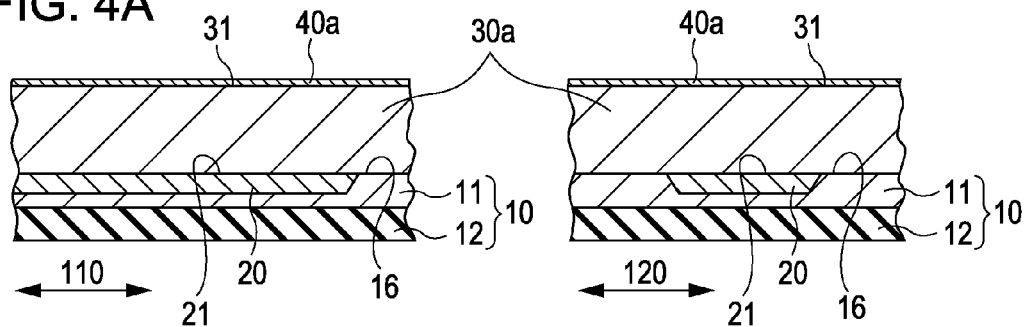
FIGS. 4A to 4D are schematic sectional views illustrating steps for manufacturing a piezoelectric element according to an embodiment of the invention.

First, as illustrated in FIG. 4A, a conductive layer 40a may be formed on the piezoelectric layer 30a. The conductive layer 40a is composed of the same or a differing material from that of the second electrode 40, and has a thickness smaller than that of the second electrode 40. The conductive layer 40a may be formed by any methods without limitation, and known film-forming methods may be used, with examples including deposition methods such as sputtering, CVD and PVD, spin coating methods, MOD methods and plating methods.

Figure 4B:
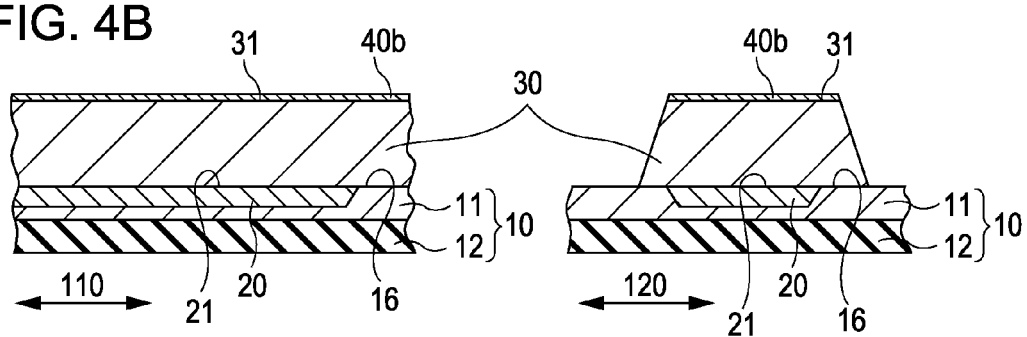

Next, the conductive layer 40a may be patterned into the desired shape to form a conductive layer 40b, and the piezoelectric layer 30a may be patterned using the conductive layer 40b as a hard mask as illustrated in FIG. 4B. The conductive layer 40a and the piezoelectric layer 30a may be patterned by a known photolithographic technique and/or a known etching technique. In an etching technique, wet etching or dry etching may be performed using a known resist that is appropriately formed. Here, although not shown, etching may be performed stepwise using a resist appropriately so as to create a contact hole in the piezoelectric layer 30 that communicates with the first electrode 20.

Figure 4C:
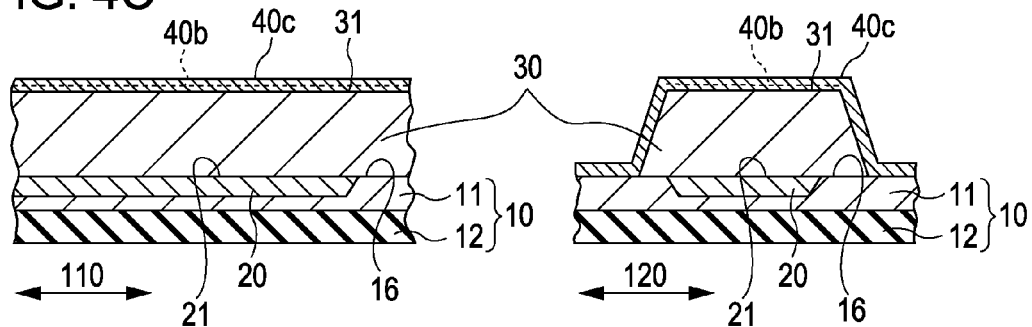

Next, as illustrated in FIG. 4C, a conductive layer 40c may be formed on the patterned piezoelectric layer 30. The conductive layer 40c may be composed of the same or a differing material from that of the second electrode 40, and can incorporate the conductive layer 40b. The conductive layer 40c may be formed by a method similar to that for the conductive layer 40a.

Figure 4D:
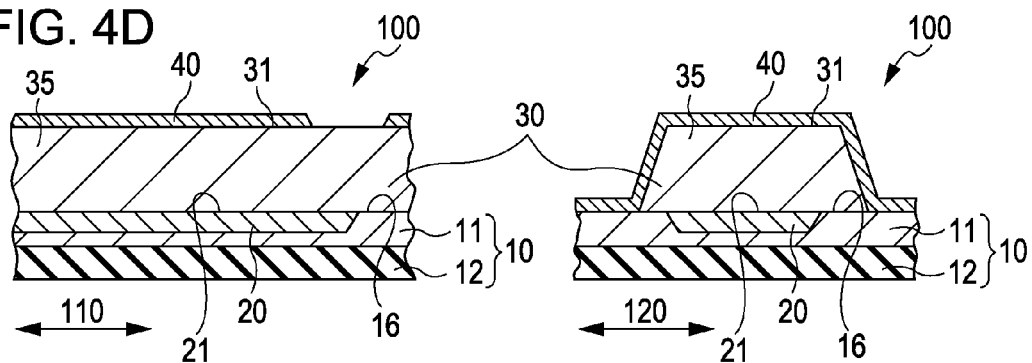

Next, as illustrated in FIG. 4D, the conductive layer 40c may be patterned into the desired shape to form the second electrode 40. The conductive layer 40c may be patterned by a method similar to that for the conductive layer 40b. In this manner, the active region 35 is formed in the piezoelectric layer 30, the region being sandwiched between the first electrode 20 and the second electrode 40 as illustrated in FIG. 4D.

The piezoelectric element 100 may be manufactured through the above-described steps. However, as described earlier, the steps for producing the piezoelectric layer 30 and the second electrode 40 are not limited to those described above. In an embodiment, which is not shown, a conductive layer may be formed on the piezoelectric layer 30a in a thickness equal to the desired thickness of the second electrode 40, and the conductive layer and the piezoelectric layer 30a may be continuously patterned through an appropriate resist to form the piezoelectric layer 30 and the second electrode 40. In another embodiment, the piezoelectric layer 30 and the second electrode 40 may be formed stepwise using a resist that is appropriately formed.

For example, the method for manufacturing the piezoelectric element according to the above embodiment has the following characteristics.

According to the method for manufacturing the piezoelectric element, the piezoelectric element 100 in the aforementioned embodiment may be manufactured. Further, the method can improve the reliability of the piezoelectric element and the yield in the production steps. Details are described below.

In general, known film-forming technology has technical difficulties in forming a piezoelectric layer in a uniform thickness when the piezoelectric layer is formed on a plane surface so as to cover a structure which has been provided on the plane surface. Further, technical difficulties are encountered in obtaining the flatness of the upper surface of the piezoelectric layer since the upper surface will reflect the shape of the structure.

According to the manufacturing method in this embodiment, the piezoelectric layer 30 is formed on the continuous flat surface constituted by the vibration plate 10 (the first surface 16) and the first electrode 10 (the upper surface 21). According to this configuration, a piezoelectric element may be manufactured in which the piezoelectric layer 30 has a more uniform thickness compared to a piezoelectric layer formed so as to cover a structure. Further, since the piezoelectric layer 30 can be crystallized on the flat surface, the crystal in the piezoelectric layer can grow stably during calcination to afford a highly uniform crystal structure of the piezoelectric layer 30. Thus, the manufacturing method according to this embodiment can provide piezoelectric elements having improved reliability.

According to the manufacturing method for the piezoelectric element in this embodiment, the piezoelectric layer 30 achieves high flatness on the upper surface 31. Since the piezoelectric layer 30a prior to the patterning has a highly flat upper surface 31 compared to a piezoelectric layer formed so as to cover a structure, resists and members such as conductive layers can be formed in uniform thickness in the subsequent steps. Consequently, the alignment accuracy in patterning is improved and the productivity of the members is enhanced. Thus, the manufacturing method for the piezoelectric element in this embodiment achieves a higher yield in the production steps.

2. Liquid Ejecting Heads

Figure 5:
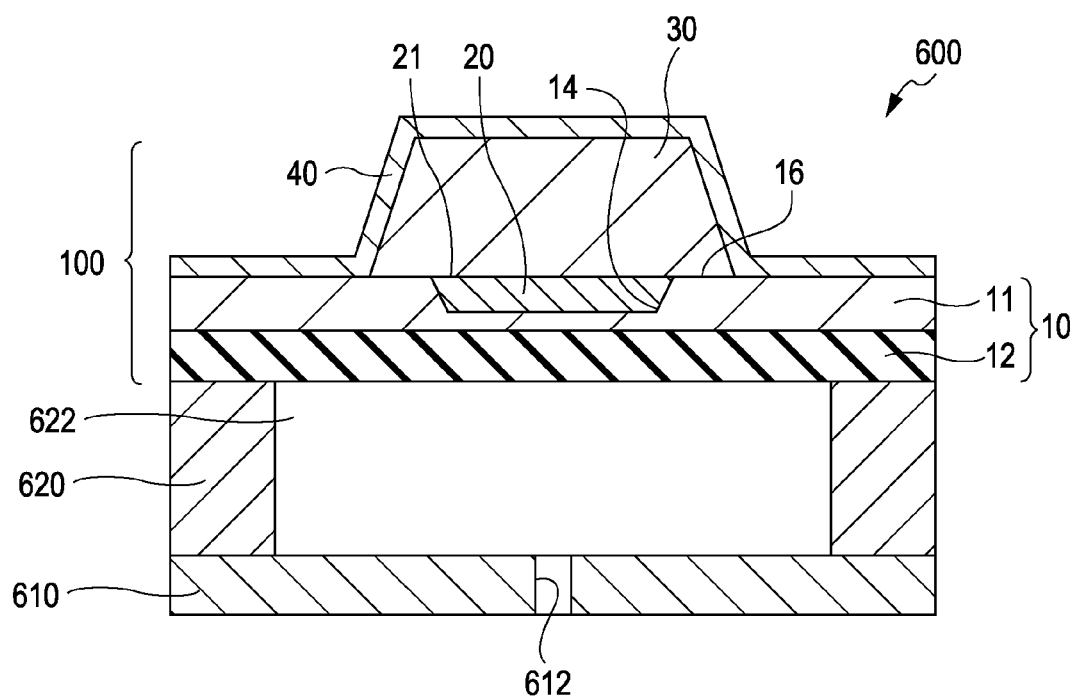
FIG. 5 is a schematic sectional view illustrating a main section of a liquid ejecting head according to an embodiment of the invention.
Figure 6:
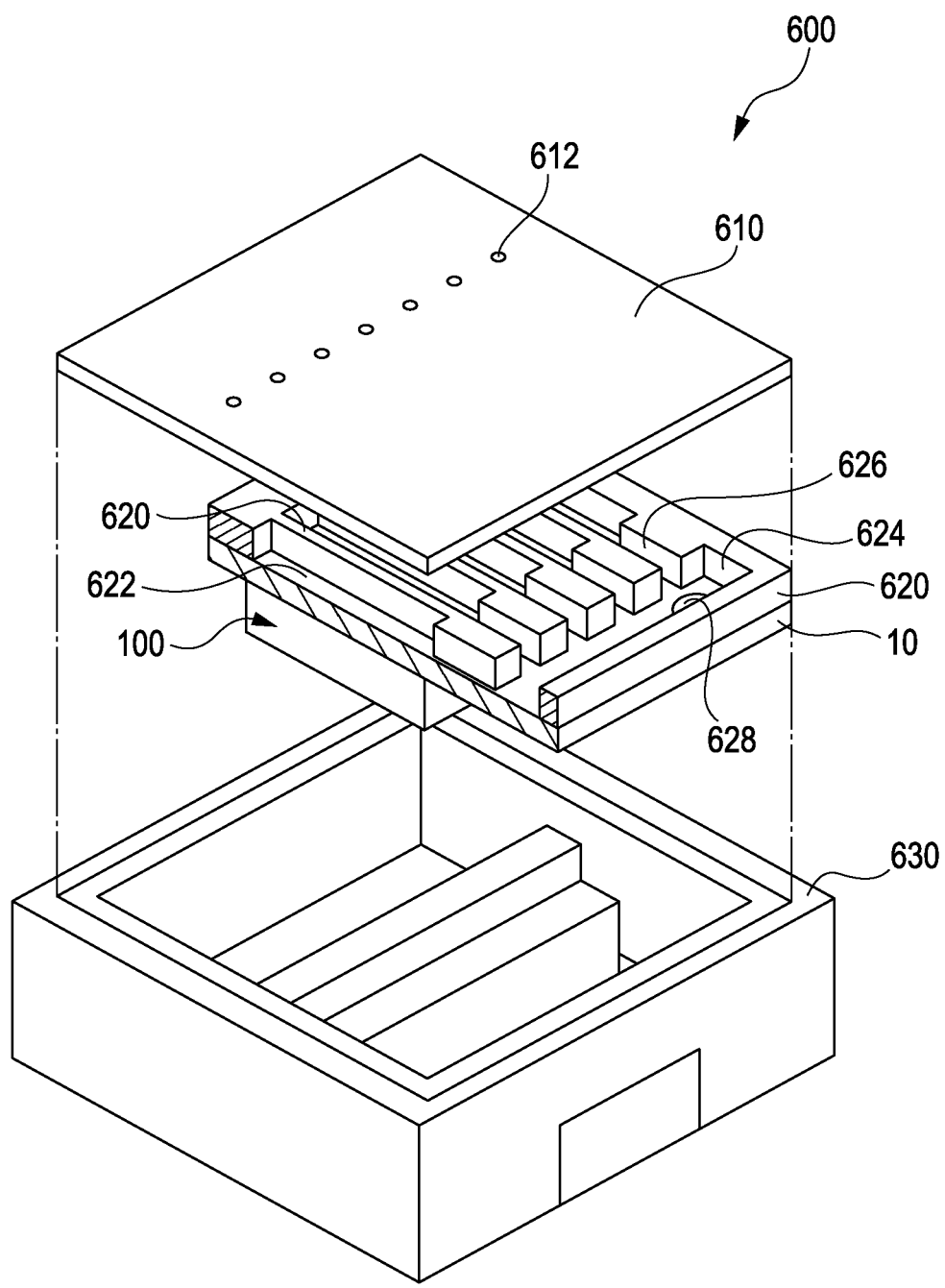
FIG. 6 is a schematic exploded perspective view illustrating the liquid ejecting head according to an embodiment of the invention.

Next, a liquid ejecting head 600 having the piezoelectric element 100 of the above embodiment will be described with reference to the attached drawings. FIG. 5 is a schematic sectional view illustrating a main section of a liquid ejecting head 600 according to an embodiment of the invention. FIG. 6 is an exploded perspective view illustrating the liquid ejecting head 600 according to this embodiment. The liquid ejecting head in FIG. 6 is illustrated upside down from the normal position in the use thereof. In FIG. 6, the illustration of the piezoelectric element 100 has been simplified.

As illustrated in FIGS. 5 and 6, the liquid ejecting head 600 includes the aforementioned piezoelectric element 100 (piezoelectric actuator 100), a nozzle plate 610 having nozzle holes 612, and a pressure chamber substrate 620 for forming pressure chambers 622.

The number of the piezoelectric elements 100 is not particularly limited, and a plurality of the piezoelectric elements 100 may be provided. In the case where plural piezoelectric elements 100 are formed, the vibration plate 10 serves as a common substrate in which a plurality of the recesses 14 are formed, and the second electrode 40 functions as a common electrode. The liquid ejecting head 600 may have a chassis 630 as illustrated in FIG. 6.

As illustrated in FIGS. 5 and 6, the nozzle plate 610 has nozzle holes 612, through which a fluid such as ink is ejected as droplets. (Herein, the fluids are not limited to liquids but include various functional materials that have been adjusted to an appropriate viscosity with solvents or dispersion media, and metal flakes. The same applies hereinafter.) In an embodiment, the nozzle plate 610 has a large number of nozzle holes 612 that are arranged in line. Exemplary materials for the nozzle plate 620 include silicon and stainless steel (SUS).

The pressure chamber substrate 620 is provided on (under in FIG. 6) the nozzle plate 610. The pressure chamber substrate 620 may be made of, for example, silicon. The pressure chamber substrate 620 partitions the space between the nozzle plate 610 and the vibration plate 10 to define a reservoir (a liquid storage portion) 624, supply ports 626 communicating with the reservoir 624, and pressure chambers 622 communicating with the respective supply ports 626 as illustrated in FIG. 6. In this embodiment, the reservoir 624, the supply ports 626 and the pressure chambers 622 are described as individual members. However, they constitute in combination the flow channels for the fluid, and the flow channels may be designed without limitation. In this illustrated embodiment, the supply ports 626 are configured such that part of the flow channel is choked. However, the supply ports may be configured appropriately in accordance with the design, and such choking ports are not necessarily an essential constituent. The reservoir 624, the supply ports 626 and the pressure chambers 622 are partitioned by the nozzle plate 610, the pressure chamber substrate 620 and the vibration plate 10. The reservoir 624 temporarily stores an ink that has been supplied from outside (for example, an ink cartridge) through a through-hole 628 formed in the vibration plate 10. The ink in the reservoir 624 can be supplied to the pressure chambers 622 through the supply ports 626. The pressure chambers 622 change the volume by the deformation of the vibration plate 10. Since the pressure chambers 622 are in communication with the nozzle holes 612, the change of the volume of the pressure chambers 622 cause the fluid to be ejected from the nozzle holes 612.

The piezoelectric element 100 is provided on (under in FIG. 6) the pressure chamber substrate 620. The piezoelectric element 100 is electrically connected with a piezoelectric element drive circuit (not shown) and is activated (vibrates or is deformed) in response to the signal from the piezoelectric element drive circuit. The vibration plate 10 is deformed by the action of the multilayer structure (the piezoelectric layer 30) and correspondingly changes the internal pressure of the pressure chamber 622.

As illustrated in FIG. 6, the chassis 630 accommodates the nozzle plate 610, the pressure chamber substrate 620 and the piezoelectric element 100. Exemplary materials for the chassis 630 include resins and metals.

The liquid ejecting head 600 includes the piezoelectric element 100 having improved reliability. Accordingly, the reliability of the liquid ejecting head is enhanced.

The liquid ejecting head 600 described herein is an ink jet recording head. However, the liquid ejecting heads of the invention can be used in other applications including colorant ejecting heads that are used in the production of color filters for liquid crystal displays and the like, electrode material ejecting heads that are used in the production of electrodes for organic electro luminescence displays, field emission displays and the like, and bioorganic material ejecting heads that are used in the production of biochips.

3. Liquid Ejecting Apparatuses

Figure 7:
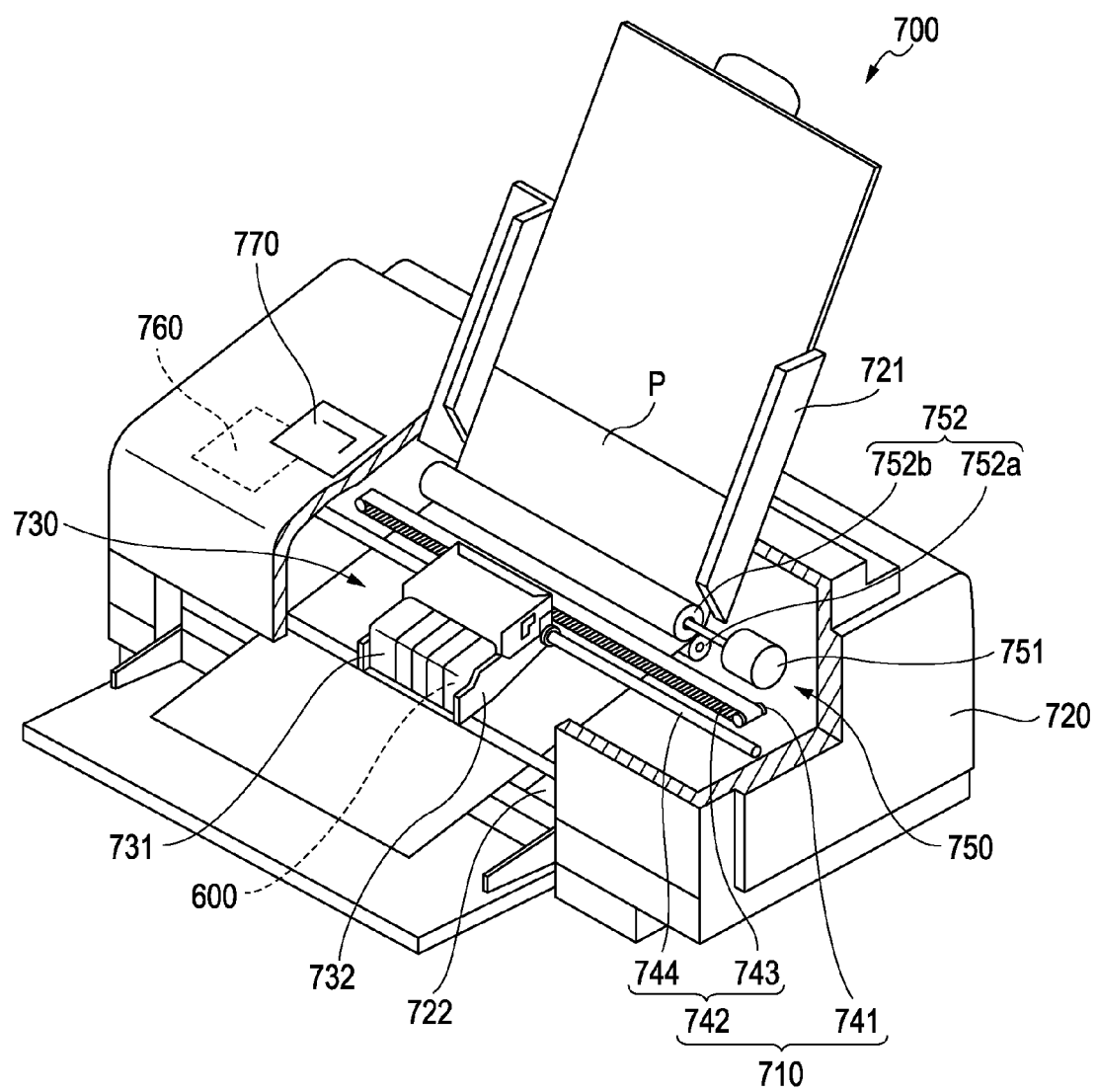
FIG. 7 is a schematic perspective view illustrating a liquid ejecting apparatus according to an embodiment of the invention.

Next, a liquid ejecting apparatus according to an embodiment of the invention will be described with reference to the attached drawing. The liquid ejecting apparatus has the aforementioned liquid ejecting head. The following will describe an ink jet printer having the aforementioned liquid ejecting head 600 as an example of the liquid ejecting apparatuses. FIG. 7 is a schematic perspective view illustrating a liquid ejecting apparatus 700 according to an embodiment of the invention.

As illustrated in FIG. 7, the liquid ejecting apparatus 700 includes a head unit 730, a drive unit 710 and a control unit 760. The liquid ejecting apparatus 700 may further include a body 720, a feeder unit 750, a tray 721 for placing recording paper P, a delivery port 722 through which the recording paper P is discharged, and a control panel 770 disposed on the upper face of the body 720.

The head unit 730 has an ink jet recording head (hereinafter, simply referred to as the head) that is constituted by the aforementioned liquid ejecting head 600. The head unit 730 further includes an ink cartridge 731 that supplies an ink to the head, and a carriage 732 that carries the head and the ink cartridge 731.

The drive unit 710 is configured to reciprocate the head unit 730. The drive unit 710 has a carriage motor 741 as a drive source for the head unit 730, and a reciprocating mechanism 742 that reciprocates the head unit 730 by the rotations of the carriage motor 741.

The reciprocating mechanism 742 has a carriage guide shaft 744 that is supported by frames (not shown) at both ends thereof, and a timing belt 743 that extends in parallel with the carriage guide shaft 744. The carriage guide shaft 744 supports the carriage 732 in a manner such that the carriage 732 can be freely reciprocated. Further, the carriage 732 is fixed to part of the timing belt 743. When the timing belt 743 runs upon the actuation of the carriage motor 741, the head unit 730 is reciprocated along the carriage guide shaft 744. The ink is appropriately ejected from the head while the head unit is being reciprocated, and thereby the recording paper P is printed.

In this embodiment, printing is performed while both the liquid ejecting head 600 and the recording paper P are being moved. However, the liquid ejecting apparatus according to the invention may be configured such that the recording paper P is printed while the liquid ejecting head 600 and the recording paper P change the relative positions. Further, the recording paper P that is printed in the above embodiment is only explanatory, and the configurations may be modified appropriately. That is, the recording media which may be printed with the use of the liquid ejecting apparatus of the invention are not limited to paper and include various media such as cloths, films and metals.

The control unit 760 controls the head unit 730, the drive unit 710 and the feeder unit 750.

The feeder unit 750 is configured to feed the recording paper P from the tray 721 toward the head unit 730. The feeder unit 750 has a feeder motor 751 as a drive source, and feeder rollers 752 that are rotated by the feeder motor 751. The feeder rollers 752 include a driven roller 752a and a driving roller 752b that are vertically opposite each other to pinch the recording paper P. The driving roller 752b is connected to the feeder motor 751. When the feeder unit 750 is driven by the control unit 760, the recording paper P is transported to pass under the head unit 730.

The head unit 730, the drive unit 710, the control unit 760 and the feeder unit 750 are accommodated in the body 720.

The liquid ejecting apparatus 700 includes the piezoelectric element 100 having improved reliability. Accordingly, the reliability of the liquid ejecting apparatus is enhanced.

Although the liquid ejecting apparatus in this embodiment is described as having one liquid ejecting head and printing the recording medium with the single liquid ejecting head, the liquid ejecting apparatus of the invention may have a plurality of liquid ejecting heads. In such a case, the plurality of liquid ejecting heads may be configured to operate individually as described above, or may be connected together to constitute a single head. For example, such a collective head may be a line head in which a plurality of the heads are arranged so as to align their nozzle holes at constant intervals.

The liquid ejecting apparatus 700 described herein is an ink jet recording apparatus (an ink jet printer). However, the liquid ejecting apparatuses of the invention also have industrial applications to eject fluids (liquid materials) such as various functional materials that have been adjusted to an appropriate viscosity with solvents or dispersion media. In addition to the image recording apparatuses such as the printers described above, the liquid ejecting apparatuses of the invention can be suitably used in applications including colorant ejecting apparatuses that are used in the production of color filters for liquid crystal displays and the like, liquid material ejecting apparatuses that are used in the production of electrodes and color filters for organic electro luminescence displays, field emission displays, electrophoretic displays and the like, and bioorganic material ejecting apparatuses that are used in the production of biochips.

The embodiments and the modified embodiments described hereinabove are only explanatory and do not limit the scope of the invention. For example, the embodiments and the modified embodiments may be appropriately carried out in combination with one another.

The scope of the invention is not limited to the embodiments described above, and includes various modifications of such embodiments. For example, embodiments having substantially the same configurations (for example, configurations having the same functions, methods and results, or configurations having the same purposes and advantageous effects) as those in the above embodiments are within the scope of the invention. Further, the scope of the invention also includes embodiments in which configurations that are not essential in the invention are replaced by other configurations. Furthermore, the scope of the invention includes configurations that can achieve the same advantageous effects or the same purposes as those described in the above embodiments. Still further, known art may be added to the configurations described in the above embodiments.

What is claimed is:

1. A piezoelectric element comprising
a vibration plate having a recess in a first surface,
a first electrode formed in the recess,
a piezoelectric layer formed on the vibration plate and the first electrode, and
a second electrode formed on the piezoelectric layer, wherein
an upper surface of the first electrode forms a continuous flat surface together with the first surface, and wherein the piezoelectric layer formed on the vibration plate and the first electrode is not present within a volume of the recess.

2. The piezoelectric element according to claim 1, wherein
the vibration plate is a laminate that includes a first layer constituting the first surface, and
the recess does not penetrate through the first layer.

3. The piezoelectric element according to claim 1, wherein
the vibration plate is a laminate that includes a first layer constituting the first surface, and
the recess penetrates through the first layer.

4. The piezoelectric element according to claim 2, wherein the first layer is zirconium oxide.

5. A liquid ejecting head comprising the piezoelectric element described in claim 4.

6. A liquid ejecting apparatus comprising the liquid ejecting head described in claim 5.

7. The piezoelectric element according to claim 1, wherein the recess has a substantively arc-like shape.

8. The piezoelectric element according to claim 1, wherein the second electrode at least in-part overlaps on the first electrode.

9. The piezoelectric element according to claim 1, wherein the vibration plate comprises a first layer, a second layer on the first layer, and a third layer.

* * * * *